United States Patent
Lee

(10) Patent No.: US 6,815,866 B2
(45) Date of Patent: Nov. 9, 2004

(54) CANTILEVER HAVING STEP-UP STRUCTURE AND METHOD FOR MANUFACTURING THE SAME

(75) Inventor: Hee-Joong Lee, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/335,892

(22) Filed: Jan. 3, 2003

(65) Prior Publication Data

US 2003/0127698 A1 Jul. 10, 2003

(30) Foreign Application Priority Data

Jan. 4, 2002 (KR) ................................. 2002-0000434

(51) Int. Cl.[7] .............................................. H02N 2/00
(52) U.S. Cl. ........................ 310/311; 310/309; 310/26
(58) Field of Search .................... 310/26, 309, 311, 310/348

(56) References Cited

U.S. PATENT DOCUMENTS

| | | | | |
|---|---|---|---|---|
| 6,384,353 B1 | * | 5/2002 | Huang et al. | 200/181 |
| 6,582,989 B2 | * | 6/2003 | Biegelsen et al. | 438/106 |
| 6,664,885 B2 | * | 12/2003 | Bromley et al. | 337/104 |
| 6,691,513 B1 | * | 2/2004 | Kolesar | 60/527 |
| 6,720,851 B2 | * | 4/2004 | Hallbjorner et al. | 335/78 |
| 2001/0012739 A1 | * | 8/2001 | Grube et al. | 439/862 |
| 2003/0179064 A1 | * | 9/2003 | Chua et al. | 336/200 |

* cited by examiner

Primary Examiner—Thomas M. Dougherty
(74) Attorney, Agent, or Firm—Staas & Halsey LLP

(57) ABSTRACT

A cantilever having a step-up structure and a method of manufacturing the same. The cantilever includes a substrate, an anchor formed on the substrate, and a moving plate connected to the anchor while maintaining a predetermined gap from the substrate. The anchor includes a first anchor of a predetermined shape and a second anchor perpendicular to an edge of the first anchor while being formed along a longitudinal axis of the moving plate. Accordingly, a deformation of the cantilever caused by the high temperature and pressure in a manufacturing process thereof is considerably reduced. As a result, the yield rate of the cantilever is improved, and the reliability of a product using the cantilever is also improved.

9 Claims, 14 Drawing Sheets

CANTILEVER HAVING STEP-UP STRUCTURE AND METHOD FOR MANUFACTURING THE SAME

CROSS-REFERENCE TO RELATED APPLICATIONS

This application claims the benefit of Korean Patent Application No. 2002-434 filed on Jan. 4, 2002, in the Korean Intellectual Property Office, the disclosure of which is incorporated herein by reference.

BACKGROUND OF THE INVENTION

1. Field of the Invention

The present invention relates to a micro electro mechanical system (MEMS) driving device, and more particularly, to a cantilever having a step-up structure which reduces a deformation of a moving plate and a method of manufacturing the same.

2. Description of the Related Art

Generally, a MEMS driving device, such as a MEMS switch, is an application device used to route a signal and match impedance networks in a radio communication system which uses microwaves or millimeter waves.

Typical MEMS techniques used to produce a MEMS are a bulk micro-machining technique and a surface micro-machining technique. The bulk micro-machine technique enables a mechanical driving by forming an air gap through melting a portion of a substrate after forming a multiple-layer on the substrate, such as a silicon substrate. The surface micro-machining technique produces a predetermined structure according to a shape designed by depositing polycrystalline silicon, a silicon oxide layer, an oxide layer, and a metal layer on a substrate. The surface micro-machining technique is used to manufacture various micro machines including an atomic force microscope (AFM) tip, a barometer, and an RF resonator.

A micro multilayer thin film cantilever having a step-up structure is an example of a MEMS driving device produced by a surface micro-machining technique.

FIG. 1 shows a perspective view of a conventional cantilever, and FIG. 2 shows a sectional perspective view of the cantilever of FIG. 1, along the cutting plane line 2—2'.

Referring to FIGS. 1 and 2, the conventional cantilever 12 formed on a substrate 10 includes a rectangular anchor 12a fixed on the substrate 10, and a moving plate 12b supported by the anchor 12a. An air gap 14 is formed between the moving plate 12b and the substrate 10. In this case, the moving plate 12b is stepped up from the anchor 12a. Accordingly, the moving plate 12b and the anchor 12a are formed with a step having a thickness of the air gap 14 therebetween.

Since the cantilever 12 is manufactured at a high temperature and under a high pressure, a remaining bending stress after the manufacturing process thereof acts on the support structure. According to a slope of the remaining bending stress, deformations of the cantilever appear, performances of the cantilever deteriorate, and the cantilever cannot be used for micro and high-precision products.

SUMMARY OF THE INVENTION

Accordingly, it is an object of the present invention to provide a micro electro mechanical system (MEMS) driving device having a step-up structure which minimizes deformations due to a manufacturing process thereof.

Another object of the present invention to provide a method of manufacturing a MEMS driving device.

Additional objects and advantages of the invention will be set forth in part in the description which follows and, in part, will be obvious from the description, or may be learned by practice of the invention.

To achieve the above and other objects of the present invention, there is provided a cantilever having a step-up structure, the cantilever comprising a substrate, an anchor formed on the substrate, and a moving plate connected to the anchor while maintaining a predetermined gap from the substrate, wherein the anchor includes a first anchor having a predetermined shape and a second anchor which is perpendicular to an edge of the first anchor while being formed along a longitudinal axis of the moving plate.

The anchor may further include a third anchor which is perpendicular to the edge of the first anchor and parallel with the second anchor. The first anchor may have a rectangular shape, and the second and third anchors may have predetermined lengths and widths, wherein a ratio of the respective widths to the respective lengths is larger than 0 and smaller than 1.

To achieve the above and/or other objects of the present invention, there is provided another cantilever having a step-up structure, the cantilever comprising a substrate, an anchor formed on the substrate, and a moving plate connected to the anchor while maintaining a predetermined gap from the substrate, wherein the anchor includes a first anchor of a predetermined shape and a second anchor formed near the first anchor. The first anchor may have a rectangular shape and the second anchor may have a slit shape perpendicular to a longitudinal axis of the moving plate.

To achieve the above and/or other objects of the present invention, there is also provided a manufacturing method for a cantilever of a step-up structure having a substrate on which a semiconductor device is formed, the method comprising forming a sacrificial layer on the substrate to cover the semiconductor device, forming an etch stop layer on the sacrificial layer, patterning the etch stop layer to expose the sacrificial layer in a predetermined shape, etching an exposed region of the sacrificial layer to expose a predetermined region which is connected to the semiconductor device, successively forming predetermined material layers on the etch stop layer to cover the exposed region so as to form the cantilever having the step-up structure, connecting a portion of the material layers on the exposed region with the substrate, and removing the sacrificial layer, wherein the patterning of the etch stop layer includes patterning first and second regions of the predetermined shape, the second region being formed along a longitudinal axis of the material layers and perpendicular to the first region.

The successively forming of the material layers may include forming a lower electrode layer on the sacrificial layer to cover the exposed region, forming a piezoelectric thin layer on the lower electrode layer, and forming an upper electrode layer on the piezoelectric thin layer. The patterning of the first and second regions may include patterning the second region having a length and a width with respect to the longitudinal axis and an axis perpendicular to the longitudinal axis of the material layers, respectively, and a ratio of the width to the length which is larger than 0 and smaller than 1.

The patterning of the etch stop layer may include patterning a third region of the predetermined shape along with the first and second regions, the third region being perpendicularly connected to the first region while being parallel with the second region along the longitudinal axis of the material layers. The third region may be patterned so as to have a predetermined length and width with respect to the longitudinal axis and an axis perpendicular to the longitudinal axis of the material layers, respectively, and a ratio of the width to the length which is larger than 0 and smaller than 1.

To achieve the above and/or other objects of the present invention, there is provided another manufacturing method for a cantilever of a step-up structure having a substrate on which a semiconductor device is formed, the method comprising forming a sacrificial layer on the substrate to cover the semiconductor device, forming an etch stop layer on the sacrificial layer, patterning the etch stop layer to expose the sacrificial layer in a predetermined shape, etching an exposed region of the sacrificial layer to expose a predetermined region which is connected to the semiconductor device, successively forming predetermined material layers on the etch stop layer to cover the exposed region so as to form the cantilever having the step-up structure, connecting a portion of the material layers on the exposed region with the substrate, and removing the sacrificial layer, wherein the patterning of the etch stop layer includes patterning first and second regions of the predetermined shape, the second region being parallel with and near the first region and perpendicular to a longitudinal axis of the material layers.

The first region may have a rectangular shape and the second region may have a slit shape.

According to the cantilever and manufacturing method for the same of the present invention, deformations of the cantilever due to the manufacturing process thereof are minimized. Consequently, the yield of the cantilever is improved, and the reliability of micro and high-precision products which use the cantilever is also improved.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
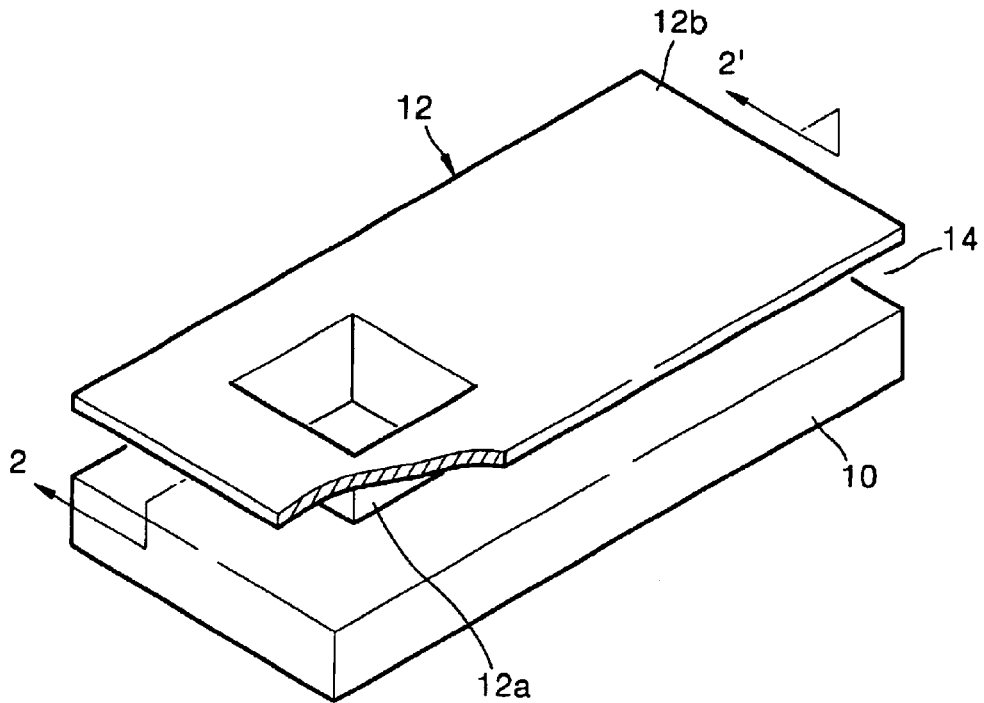
FIG. 1 is a perspective view of a cantilever having a conventional step-up structure.
Figure 2:
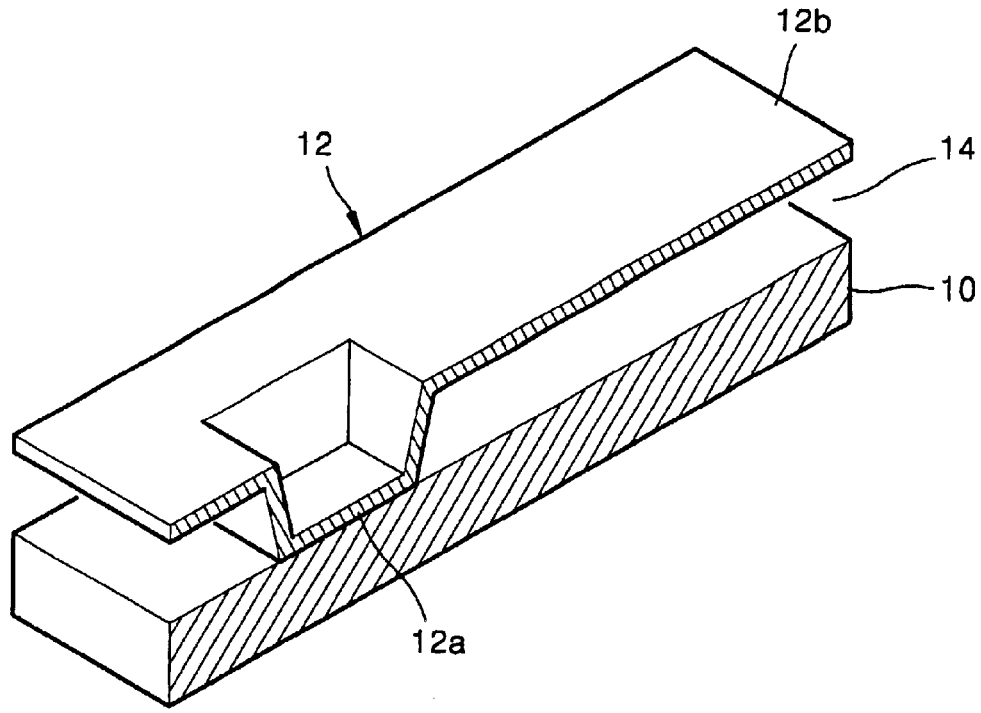
FIG. 2 is a sectional perspective view of the cantilever shown in FIG. 1 along the cutting plane line 2—2'.

Reference will now be made in detail to the embodiments of the present invention, examples of which are illustrated in the accompanying drawings, wherein like reference numerals refer to the like elements throughout. The embodiments are described below in order to explain the present invention by referring to the figures.

A cantilever and a method of manufacturing the same according to the present invention will now be described in detail with reference to the accompanying drawings. In the drawings, the thickness of layers and regions of the cantilever are exaggerated for clarity.

To minimize a bending deformation of an anchor of a cantilever in a manufacturing process thereof, new shapes for the anchor are modeled, and a computer simulation of the new shapes is performed by using a finite element method (FEM). The cantilever anchors are then manufactured in the modeled shapes and are measured to determine optimal anchor shape(s) of minimum deformation. After establishing a controlled factor to minimize the anchor deformation, an optimal shape of the anchor having a minimum deformation is decided based on the controlled factor.

<Modeling>

To choose an anchor shape that minimizes a deformation in a step-up portion, which connects the anchor of a cantilever to a moving plate, the cantilevers having anchors of different shapes are designed as shown in FIGS. 3 through 6.

Referring to FIGS. 3 through 6, plane views of the corresponding cantilevers are shown in FIGS. 3A, 4A, 5A, and 6A. FIGS. 3B, 4B, 5B, and 6B show sectional perspective views illustrating sections of the corresponding cantilever anchors along the longitudinal axes of the cantilevers.

Figure 3A:
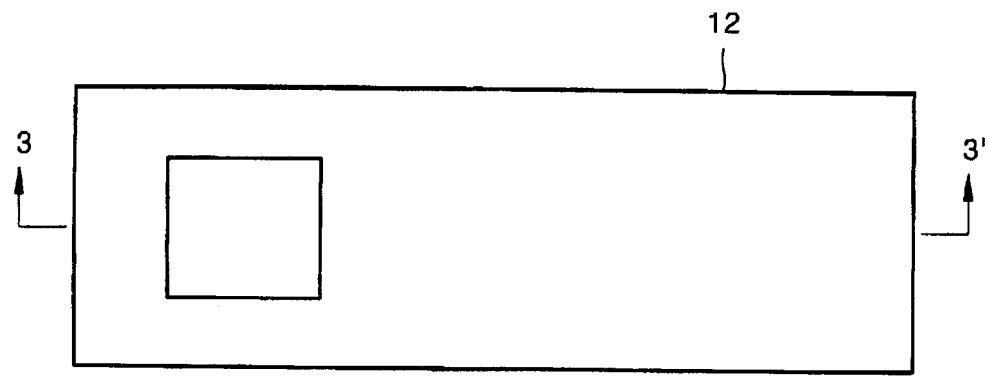
FIG. 3A is a plane view of a conventional cantilever used as a first cantilever to model the cantilever having a step-up structure according to the present invention.

FIG. 3A illustrates a conventional cantilever which is used as a comparative sample and referred herein below as the first cantilever 12. FIGS. 4A through 6B illustrate second through fourth cantilevers 42, 54, and 64 according to the present invention.

Figure 3B:
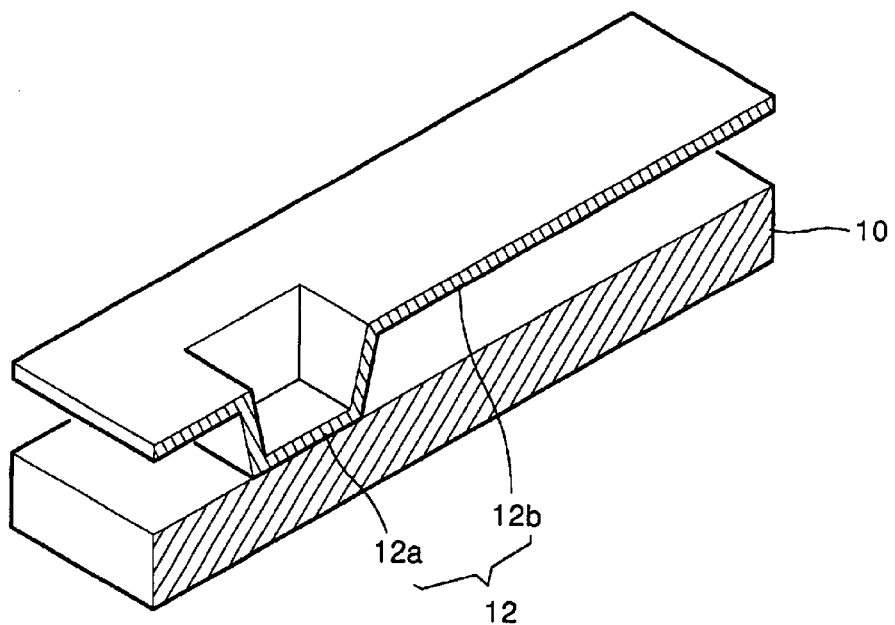
FIG. 3B is a sectional perspective view of the cantilever shown in FIG. 3A along the cutting plane line 3—3'.

Comparing FIGS. 3A and 3B with FIGS. 4A through 6B, the shape of an anchor 12a of the first cantilever 12 is different from the shapes of anchors 42a, 54a, and 64a of the second through fourth cantilevers 42, 54, and 64. The differences are clearly shown in the plane views shown in FIGS. 3A, 4A, 5A and 6A.

Figure 4A:
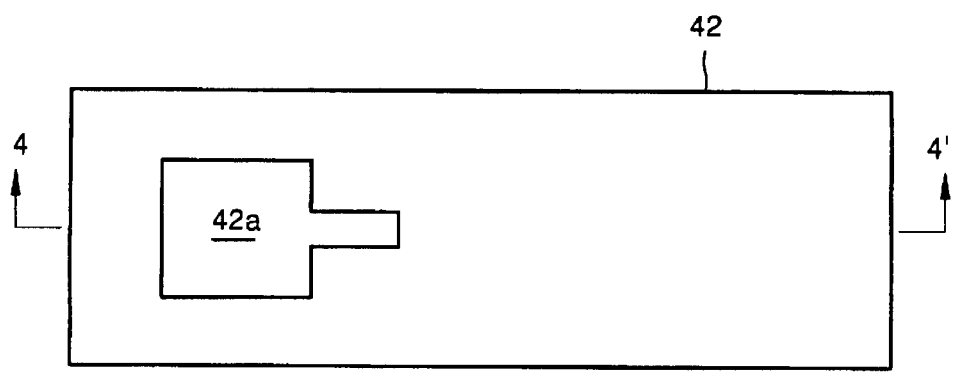
FIG. 4A is a plane view of a second cantilever used to model the cantilever having a step-up structure according to an embodiment of the present invention.
Figure 4B:
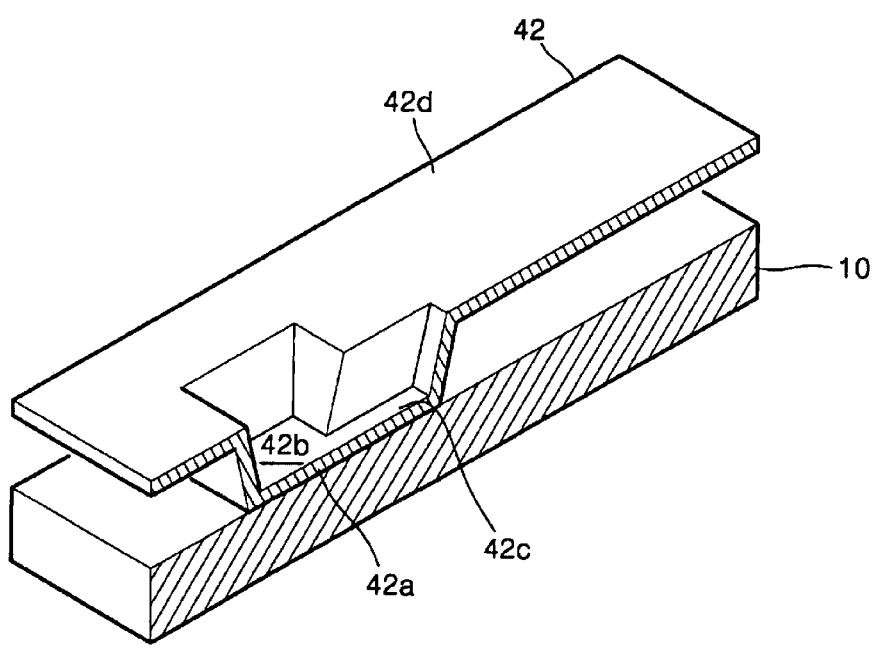
FIG. 4B is a sectional perspective view of the cantilever shown in FIG. 4A along the cutting plane line 4—4'.
Figure 5A:
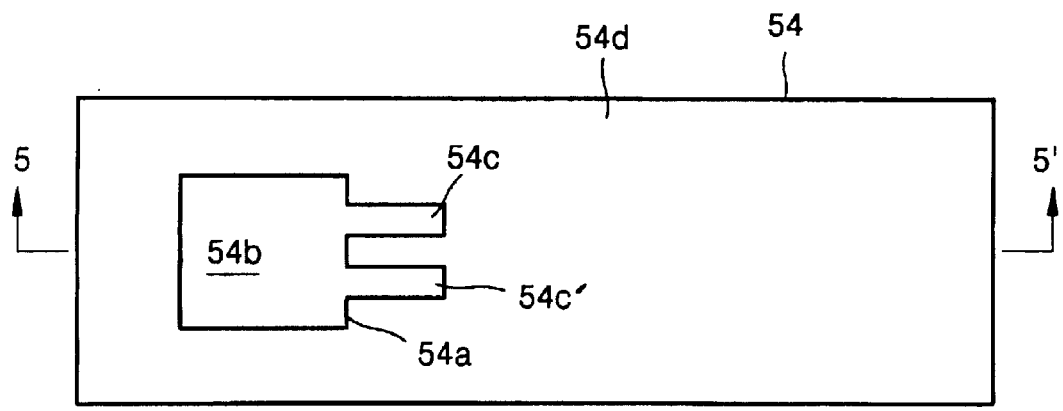
FIG. 5A is a plane view of a third cantilever used to model the cantilever having a step-up structure according to another embodiment of the present invention.
Figure 5B:
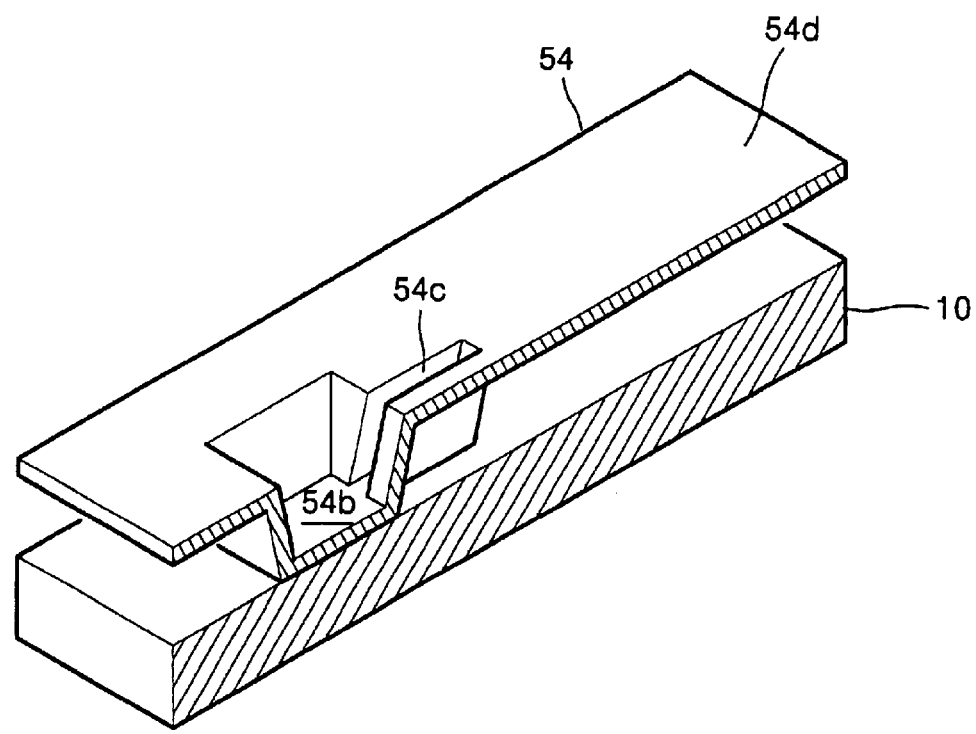
FIG. 5B is a sectional perspective view of the cantilever shown in FIG. 5A along the cutting plane line 5—5'.
Figure 6A:
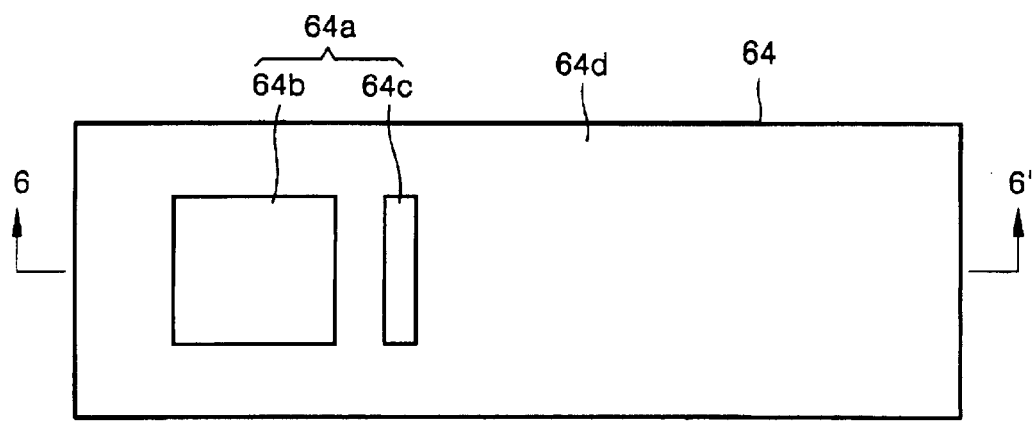
FIG. 6A is a plane view of a fourth cantilever used to model the cantilever having a step-up structure according to yet another embodiment of the present invention.
Figure 6B:
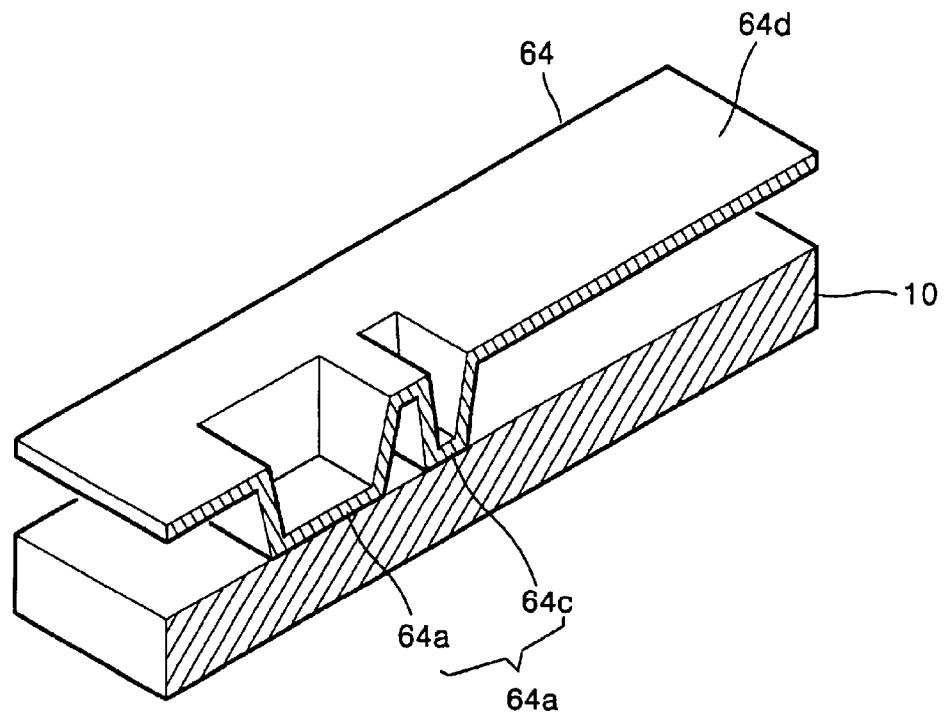
FIG. 6B is a sectional perspective view of the cantilever shown in FIG. 6A along the cutting plane line 6—6'.

The anchor 12a of the first cantilever 12 has a rectangular shape. Referring to FIG. 4B, the anchor 42a of the second cantilever 42 is formed by adding a first anchor 42c to a rectangular anchor 42b, perpendicular to one side of the rectangular anchor 42b while having a predetermined length and width in a direction of a length of a moving plate 42d. Referring to FIG. 5A, the anchor 54a of the third cantilever 54 is formed by adding first and second anchors 54c and 54c', with the same dimensions as the first anchor 42c of the second cantilever 42, to a rectangular anchor 54b. In this case, a reference numeral 54d denotes a moving plate.

Referring to FIG. 6, the anchor 64a of the fourth cantilever 64 includes a rectangular anchor 64b and a first anchor 64c near the rectangular anchor 64b while being perpendicular to a longitudinal axis of a moving plate 64d.

Structural analysis of the first through fourth cantilevers 12, 42, 54, and 64 shown in FIGS. 3 through 6 is performed using an FEM software. The results of the analysis are shown in Table 1 and FIG. 7.

TABLE 1

| Cantilever | $\delta_{max}$ ($\mu$m) |
|---|---|
| first cantilever | 9.911 |
| second cantilever | 3.285 |
| third cantilever | 5.919 |
| fourth cantilever | 8.971 |

Figure 7:
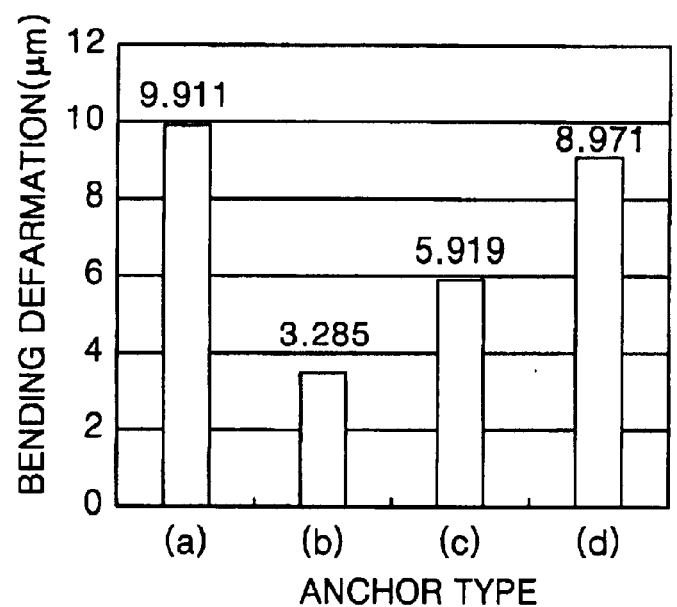
FIG. 7 is a bar graph illustrating a result of a finite element method (FEM) analysis of the cantilevers shown in FIGS. 3 through 6.

In FIGS. 7, (a), (b), (c), and (d) denote the types of the anchors of the first through fourth cantilevers 12, 42, 54, and 64. In Table 1, $\delta_{MAX}(\mu m)$ denotes the bending deformation at ends of the cantilevers.

Referring to Table 1 and FIG. 7, the bending deformation at the end of the first cantilever is 9.911 $\mu$m. However, the bending deformations of the second, third, and fourth cantilevers are smaller than that of the first cantilever. As shown in Table 1 and FIG. 7, the bending deformation of the second cantilever is the smallest.

The result of the modeling analysis shows that the bending deformations of the cantilevers having the anchors according to the present invention are reduced from the bending deformation of the first cantilever, and a reduction of, for example, 70% can be achieved.

EXPERIMENTAL EXAMPLE

To verify the results of the modeling analysis, the first through fourth cantilevers are manufactured, and the bending deformations at ends of the cantilevers are measured. A method of manufacturing the cantilevers will now be described with reference to FIGS. 8 through 17.

Figure 8:
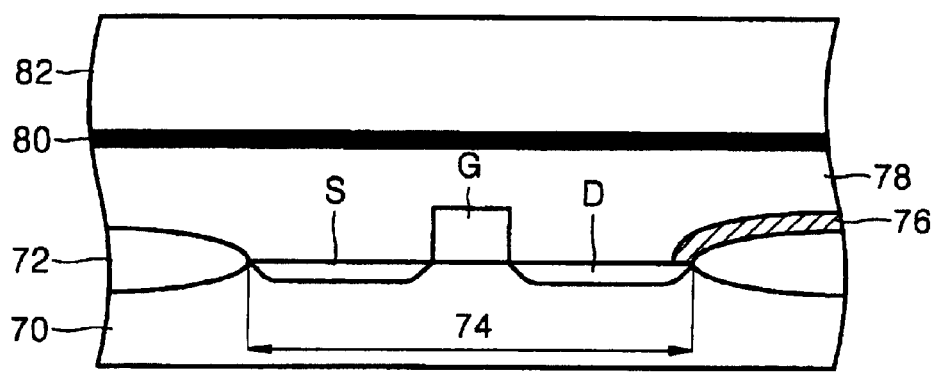
FIGS. 8–11, 12A–12B, 13A–13B, and 14–17 are perspective and sectional views illustrating a manufacturing process for the cantilever shown in FIG. 4 to measure a deformation amount of the cantilever having the step-up structure of the present invention.

As shown in FIG. 8, to manufacture the second cantilever, a field oxide layer 72 is formed on a predetermined region of a substrate 70 to define an active region 74. After forming a gate electrode G on the active region, a source S and a drain D are formed at corresponding sides of the gate electrode G to form a transistor. A sacrificial layer 78 such as a phosphosilicate glass (PSG) layer is formed on the substrate 70 having the transistor. The sacrificial layer 78 will be removed to form an air gap between the substrate 70 and a MEMS driving device. An etch stop layer 80 and a photosensitive layer 82 are then successively formed on the sacrificial layer 78. The photosensitive layer 82 is patterned by using a mask having the same pattern as the anchor 42a of the second cantilever 42 shown in FIG. 4A.

Figure 9:
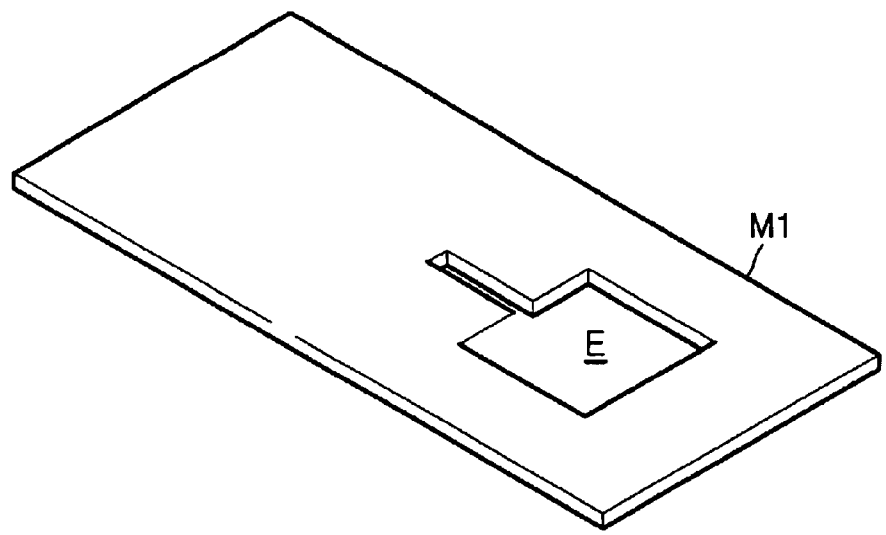
Figure 10:
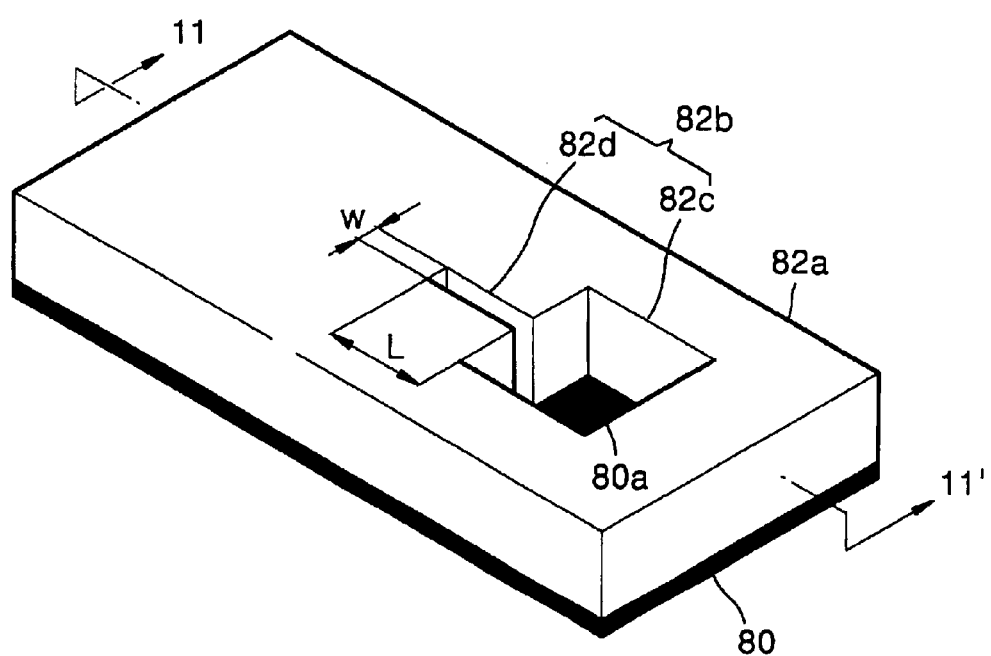

FIG. 9 shows a perspective view of the mask, and FIG. 10 is a perspective view of a photosensitive layer pattern 82a formed by using the mask of FIG. 9. In FIG. 9, M1 denotes a first mask and E denotes an exposure window, having the same shape as the anchor 42a of the second cantilever 42 shown in FIG. 4, to form the same pattern as the anchor 42a on the photosensitive layer 82.

Referring to FIG. 10, an anchor pattern 82b, having the same shape as the anchor 42a of the second cantilever 42 shown in FIG. 4, is formed on the photosensitive layer pattern 82a. In this case, the etch stop layer 80 is exposed through the anchor pattern 82b. The anchor pattern 82b is formed by a first pattern 82c in a rectangular shape and a second pattern 82d which protrudes perpendicularly to one side of the first pattern 82c by a predetermined length L. The width W of the second pattern 82d is narrower than the length L.

For convenience, the elements formed under the etch stop layer 80 are omitted in FIG. 10.

Figure 11:
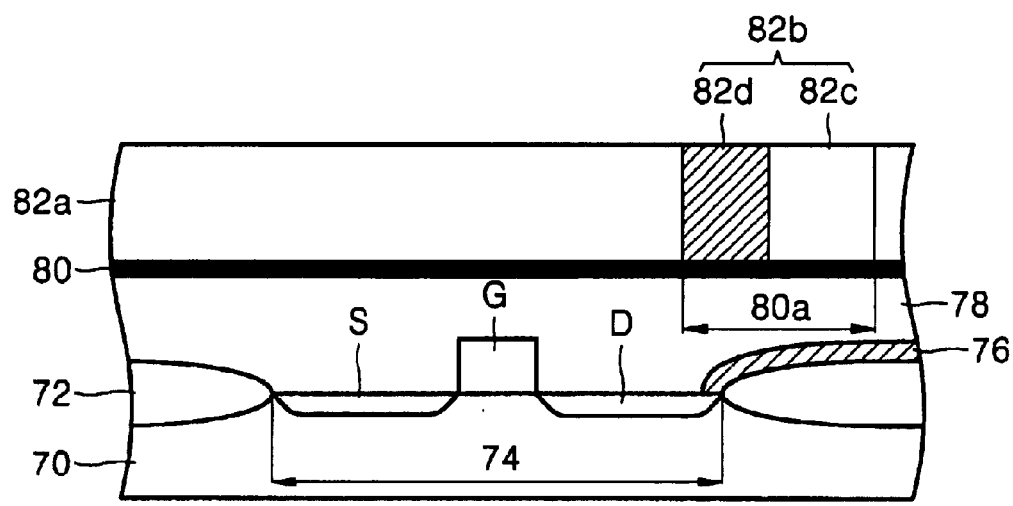

FIG. 11 illustrates the result of a patterning, and shows a sectional view of the anchor pattern 82b of the photosensitive layer pattern 82a along the cutting plane line 11—11' shown in FIG. 10. A rectangular hatched section in FIG. 11 denotes the second pattern 82d of the photosensitive layer pattern 82a.

Figure 12A:
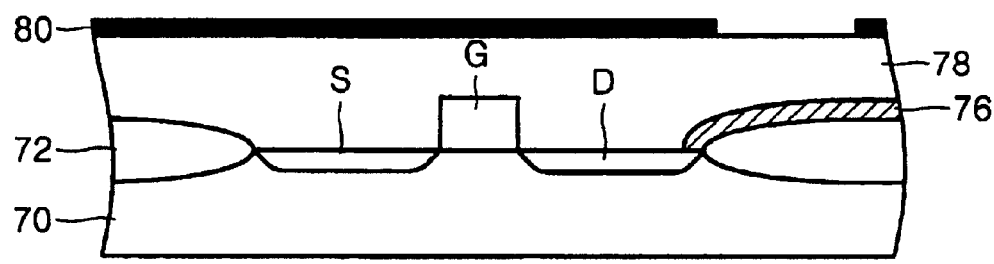
Figure 12B:
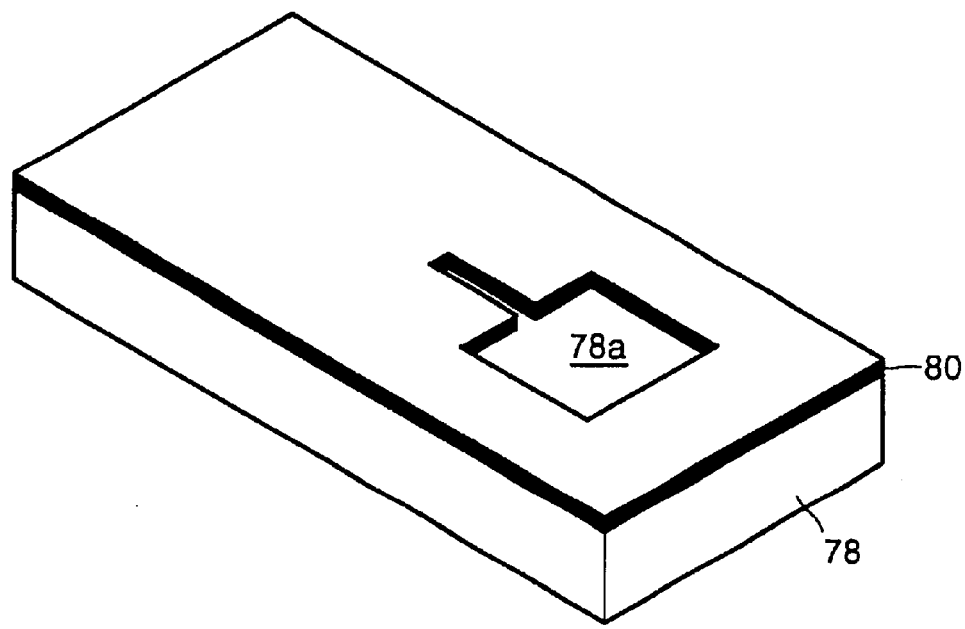

A region 80a of the etch stop layer 80 exposed through the first and second patterns 82c and 82d is removed by using the photosensitive layer pattern 82a as an etch mask. Successively, the photosensitive layer pattern 82a is removed. FIGS. 12A and 12B illustrate sectional and perspective views of the second cantilever after removing the photosensitive layer pattern 82a, respectively. In FIG. 12B, the elements formed under the sacrificial layer 78 are omitted for convenience. A reference numeral 78a denotes a region of the sacrificial layer exposed through the removed region 80a of the etch stop layer 80. For example, a wet etching is performed by using the etch stop layer 80 as an etch mask until a drain pad layer 76 is exposed. Hydrogen fluoride (HF) may be used as an etching solution for the wet etch.

Figure 13A:
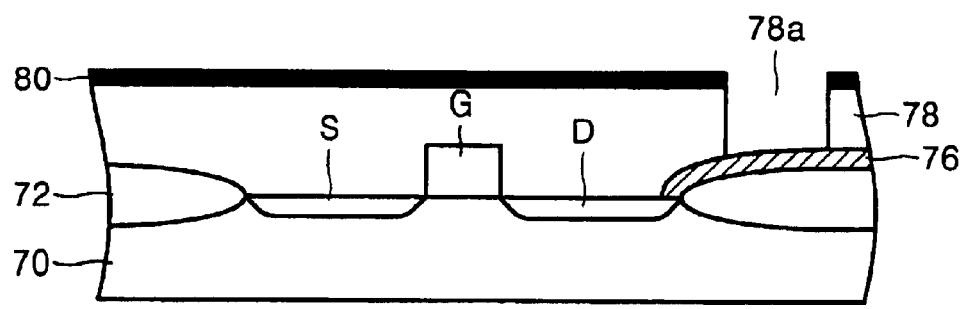
Figure 13B:
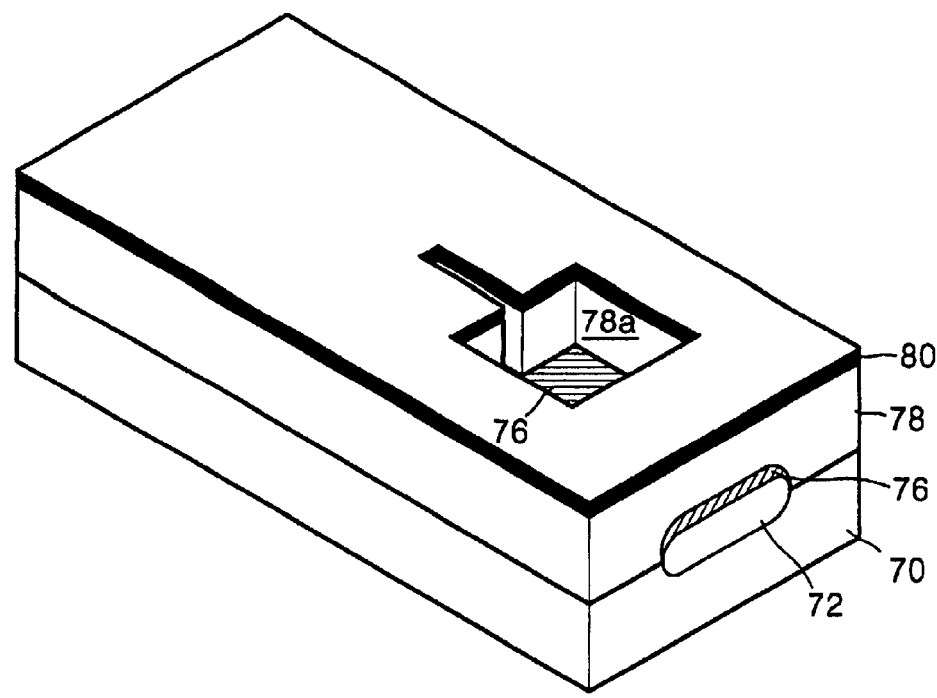

FIGS. 13A and 13B illustrate sectional and perspective views of the second cantilever after the wet etching operation, respectively.

In FIG. 13A, a first via hole 78a having the same shape as the anchor pattern 82b (see FIGS. 10 and 11) is formed on the sacrificial layer 78 to expose a drain pad layer 76.

Figure 14:
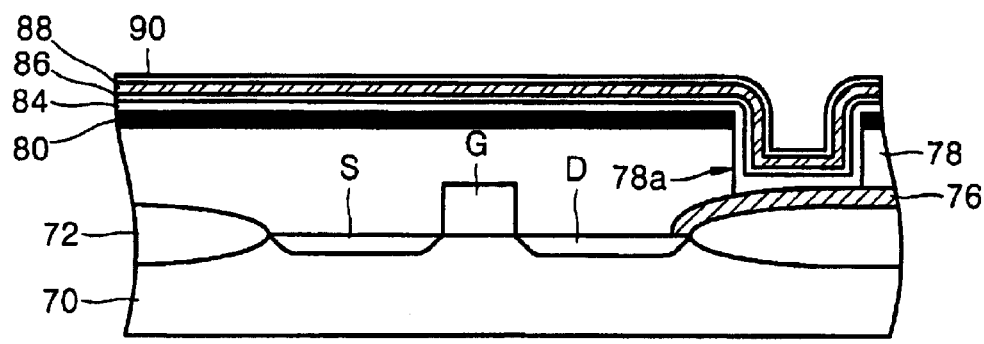

As shown in FIG. 14, after performing the wet etching operation, material layers to form the step-up driving device are successively formed on the etch stop layer 80 to connect to the drain pad layer 76. That is, a nitride layer (SiNx) 84, for example, as an anchor layer, is formed on the etch stop layer 80 to cover the drain pad layer 76, which is exposed through the first via hole 78a. Then, a lower electrode 86, a dielectric layer 88, and an upper electrode 90 are successively formed on the nitride layer 84. The lower electrode 86 is formed of, for example, platinum (Pt). The dielectric layer 88 is formed of, for example, a PZT layer as a piezoelectric thin film, which is formed by, for example, a sol-gel method. The upper electrode 90 is formed of, for example, platinum and forms an electric field in the dielectric layer 88 with the lower electrode 86.

Figure 15:
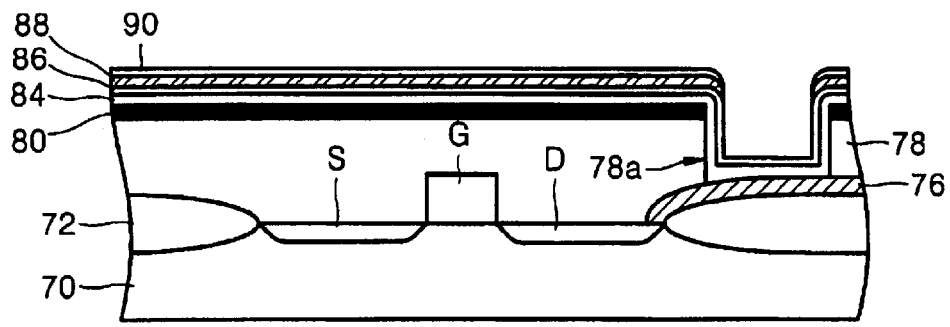

As shown in FIG. 15, after forming the above-described thin layers for the step-up driving device, the lower electrode 86 is exposed by removing portions of the upper electrode 90 and the dielectric layer 88.

Figure 16:
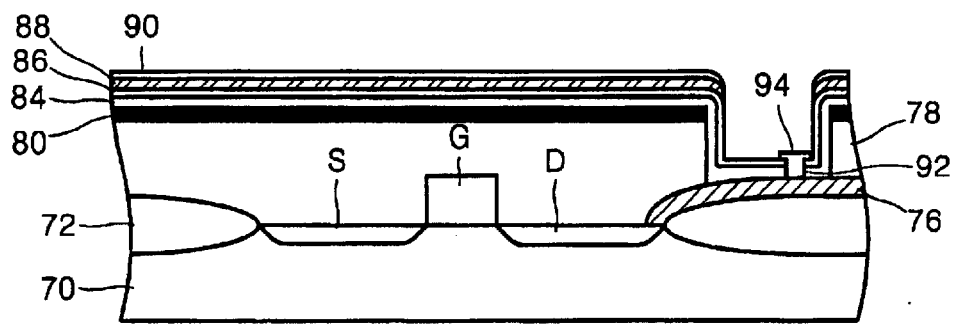

Referring to FIG. 16, a second via hole 92 is formed on the exposed region of the lower electrode 86 by penetrating the nitride layer 84, thereby exposing the drain pad layer 76. The second via hole 92 is filled with a conductive plug 94 to connect the lower electrode 86 to the drain pad layer 76. The conductive plug 94 becomes a path to apply a signal voltage to the layers that form the driving device, which are formed on the etch stop layer 80, and support the MEMS driving device having the step-up structure after removing the sacrificial layer 78.

Figure 17:
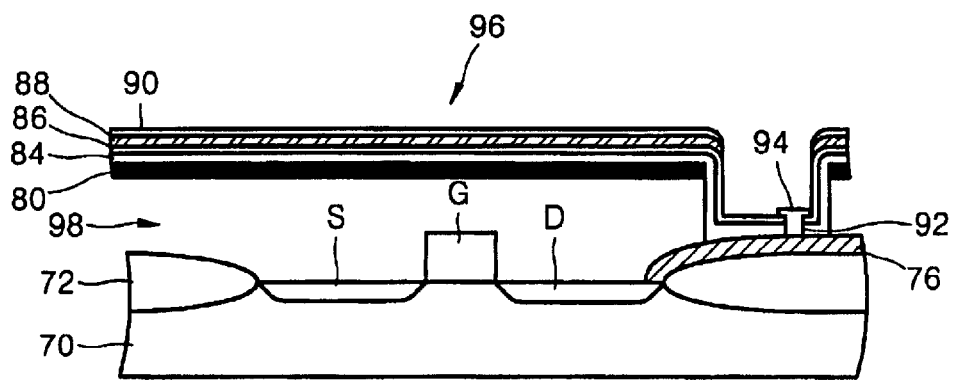

As shown in FIG. 17, the sacrificial layer 78 (see FIG. 16) formed between the substrate 70 and the etch stop layer 80 is removed by, for example, a wet etching method. Accordingly, an air gap 98 is formed between the substrate 70 and a cantilever 96. As a result, the MEMS driving device, i.e., the cantilever 42 having the anchor 42a with the rectangular anchor 42b and the first anchor 42c (see FIG. 4B) in a step-up structure is formed.

The methods used to manufacture the first, third, and fourth cantilevers 12, 54 and 64 are the same as the method used to manufacture the second cantilever 42, except for the respective masks used to pattern the photosensitive layer 82.

Figure 18:
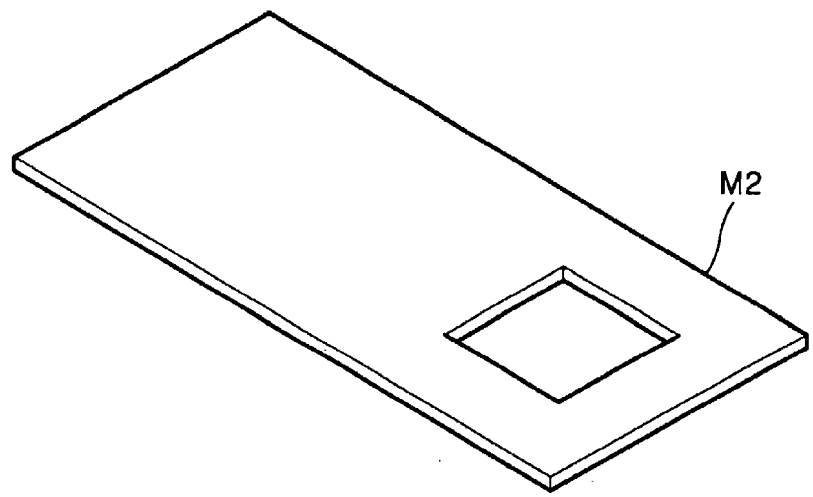
FIGS. 18 through 20 are perspective views of masks used to manufacture the cantilevers of FIGS. 3A, 5A, and 6A, respectively.
Figure 19:
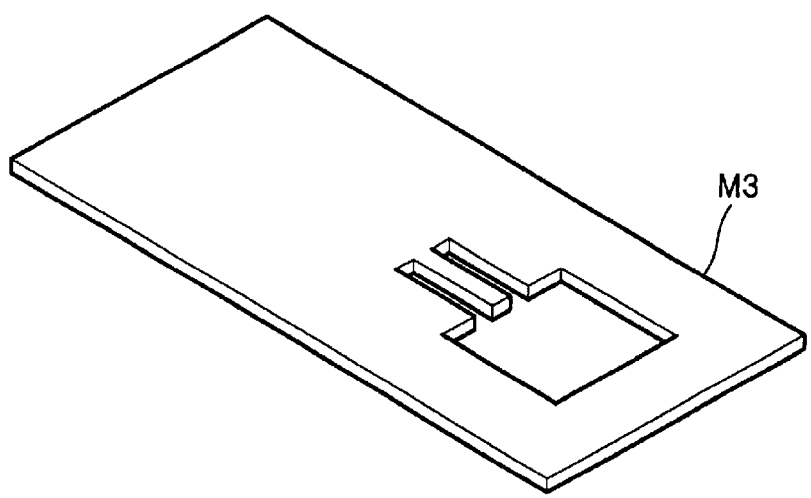
Figure 20:
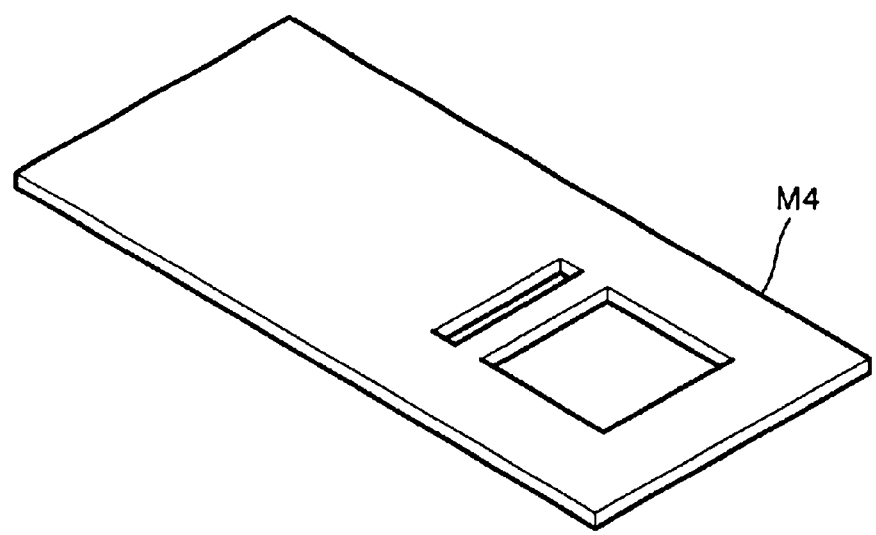

In other words, a second mask M2 shown in FIG. 18 is used to manufacture the first cantilever 12, and a third and fourth masks M3 and M4 shown in FIGS. 19 and 20 are used to manufacture the third and fourth cantilevers 54 and 64, respectively.

Accordingly, deformations of the cantilevers having anchors of different shapes are measured at the ends of the moving plates of the cantilevers. In this case, the deformations are measured by using a micro focus measuring system. The result of the measurement is illustrated in Table 2 and FIG. 21.

TABLE 2

| Cantilever | $\delta_{MAX}$ ($\mu$m) |
|---|---|
| first cantilever | 9.3 |
| second cantilever | 5.0 |
| Third cantilever | 6.4 |
| fourth cantilever | 8.5 |

Figure 21:
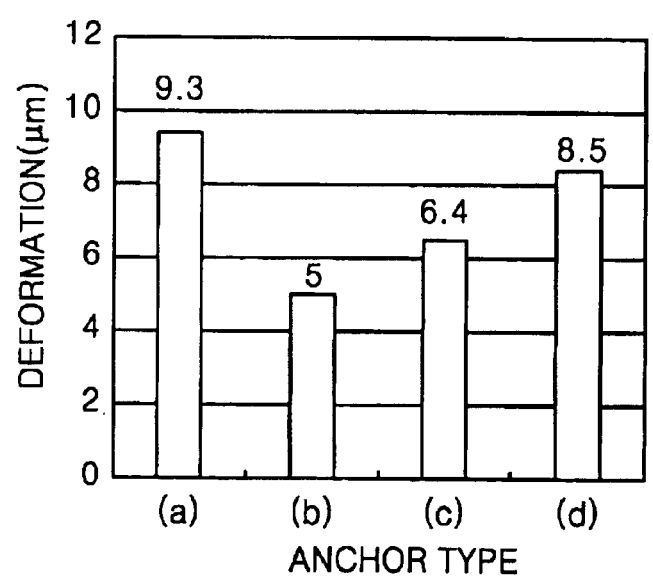
FIG. 21 is a bar graph illustrating deformation amounts of the cantilevers of FIGS. 3A, 4A, 5A, and 6A, respectively, manufactured according to the present invention.

In FIGS. 21, (a), (b), (c), and (d) denote the types of the anchors of the first through fourth cantilevers 12, 42, 54 and 64, respectively.

<Comparison Between the Results of Modeling and Experimental Example>

Figure 22:
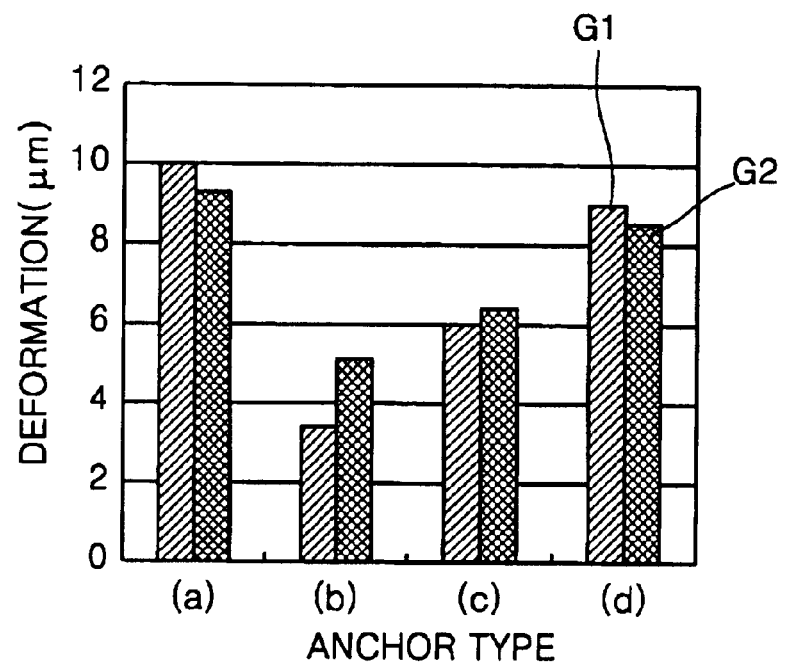
FIG. 22 is a bar graph illustrating the result of the comparison of FIG. 7 and FIG. 21.

Table 3 illustrates deformations of the moving plates of the first through fourth cantilevers 12, 42, 54 and 64, which are obtained from the FEM analysis and experiment. FIG. 22 shows a graph illustrating the above deformation results. Reference numerals G1 and G2 in FIG. 22 denote the results of the FEM analysis and experiment, respectively.

TABLE 3

| | $\delta_{MAX}$ ($\mu$m) | |
|---|---|---|
| cantilevers | analysis results | experimental result |
| first cantilever | 9.911 | 9.3 |
| second cantilever | 3.285 | 5.0 |
| third cantilever | 5.919 | 6.4 |
| fourth cantilever | 8.971 | 8.5 |

Referring to Table 3 and FIG. 22, the results of the FEM analysis and the examination are fairly the same, indicating that the results of the FEM analysis are reliable.

Where the shape of a cantilever anchor is one of the shapes of the second through fourth cantilever anchors, i.e., 42a, 54a and 64a, the deformation against a moving plate of the cantilever is smaller than the deformation in the first cantilever 12.

To examine the change in bending deformations of a cantilever according to the sizes of a rectangular anchor and other portions, the second cantilever 42 having the minimum deformation is used as a basis for the analysis.

That is, to examine the change in a bending deformation of the moving plate 42d of the second cantilever 42 shown in FIG. 4, according to the size of the first anchor 42c perpendicular to one side of the rectangular anchor 42b, a width of the first anchor 42c is varied while the length of the first anchor 42c is kept constant to a predetermined value of, for example, 10 $\mu$m. While varying the width of the first anchor 42c, the change in the bending deformation at the ends of the moving plate 42d of the second cantilever 42 is analyzed using an FEM software.

Figure 23:
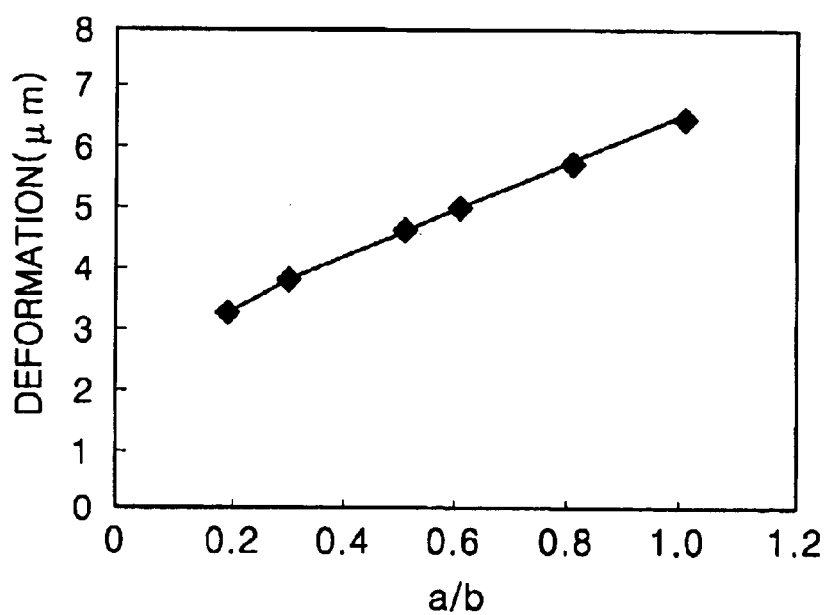
FIG. 23 is a graph illustrating a deformation amount of a cantilever according to the present invention while varying the ratio of width to length of a second anchor of the cantilever.

Table 4 and FIG. 23 illustrate the results of this analysis.

TABLE 4

| a ($\mu$m) | b ($\mu$m) | a/b | deformation ($\mu$m) |
|---|---|---|---|
| 2 | 10 | 0.2 | 3.285 |
| 3 | 10 | 0.3 | 3.792 |
| 5 | 10 | 0.5 | 4.649 |
| 6 | 10 | 0.6 | 5.028 |
| 8 | 10 | 0.8 | 5.756 |
| 10 | 10 | 1.0 | 6.510 |

Eelements a and b in Table 4 and FIG. 23 denote the width and length of the first anchor 42c, respectively.

Referring to Table 4 and FIG. 23, as the width of the first anchor 42c increases, the bending deformation of the moving plate 42d increases. In a case where the width and length of the first anchor 42c are the same, the bending deformation of the moving plate 42d is 6.510 $\mu$m, much smaller than a bending deformation of 9.911 $\mu$m of the moving plate 12b of the first cantilever 12. However, a driving characteristic of the moving plate 42d may deteriorate where the width and length of the first anchor 42c are the same. Consequently, the size of the first anchor 42c is decided so as to minimize the bending deformation while adjusting the ratio of the width to the length (a/b) of the first anchor 42c to be lower than 1. Where the length of the first anchor 42c is excessively increased while keeping the width constant, the length of the moving plate 42d for an actual drive is shortened, thereby deteriorating the driving characteristic of the moving plate 42d.

While this invention has been particularly shown and described with reference to embodiments thereof, it is understood that they are merely illustrative and are not intended to limit the scope of the invention. For example, a rectangular portion of an anchor may be changed into a circular one, and a multiple-layer dielectric layer may be substituted for a dielectric layer. In addition, a cantilever having a combined shape of the second and fourth cantilevers 42 and 64 may be realized.

As described above, the present invention discloses a MEMS driving device having a step-up structure, and more particularly, a multiple-layer cantilever having a first anchor of a rectangular shape, and a second anchor which is perpendicular to one side of the first anchor and parallel with a longitudinal axis of a moving plate of the multiple-layer cantilever. By arranging the second anchor as mentioned above, deformation of the cantilever, namely, deformation of the moving plate of the cantilever caused by the high temperature and pressure in a manufacturing process thereof, is considerably reduced. As a result, the yield rate of the cantilever is improved, and the reliability of a product using the cantilever is also improved.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A cantilever having a step-up structure, comprising:

a substrate;

an anchor formed on the substrate; and a moving plate connected to the anchor while maintaining a predetermined gap from the substrate, wherein the anchor includes:
 a first anchor having a predetermined shape, and
 a second anchor which is perpendicular to an edge of the first anchor while being formed along a longitudinal axis of the moving plate.

2. The cantilever having a step-up structure of claim 1, wherein the anchor further includes a third anchor which is perpendicular to the edge of the first anchor and parallel with the second anchor.

3. The cantilever having a step-up structure of claim 2, wherein:

the first anchor has a rectangular shape, and the second and third anchors have corresponding lengths and widths, where a ratio of the respective widths to the respective lengths is larger than 0 and smaller than 1.

4. A cantilever having a step-up structure, comprising:

a substrate;

an anchor formed on the substrate; and a moving plate connected to the anchor while maintaining a predetermined gap from the substrate, wherein the anchor includes a first anchor of a predetermined shape and a second anchor formed near the first anchor.

5. The cantilever having a step-up structure of claim 4, wherein:

the first anchor has a rectangular shape, and the second anchor has a slit shape perpendicular to a longitudinal axis of the moving plate.

6. A micro electro mechanical system, comprising:

a substrate;

a cantilevered structure comprising:
 a moveable plate; and
 an anchor integrally formed with the moveable plate and which maintains the moveable plate at a predetermined distance from the substrate, wherein the anchor is formed as a plurality of cavities in the moveable plate.

7. The system of claim 6, wherein:

the plurality of cavities comprises first and second cavities;

the first cavity is larger than the second cavity and is formed closer to a first end of the moveable plate than the second cavity; and the first and second cavities are joined to form a contiguous volume.

8. The system of claim 6, wherein:

the plurality of cavities comprises first, second and third cavities;

the first cavity is larger than either of the second and third cavities and is formed closer to a first end of the moveable plate than the second and third cavities; and the first, second and third cavities are joined to form a contiguous volume.

9. The system of claim 6, wherein:

the plurality of cavities comprises first and second cavities;

the first cavity is larger than the second cavity and is formed closer to a first end of the moveable plate than the second cavity; and the first and second cavities are separated to form independent volumes.

* * * * *